United States Patent
Kutsuki et al.

(10) Patent No.: US 12,369,339 B2
(45) Date of Patent: Jul. 22, 2025

(54) SURFACE TREATMENT METHOD FOR GALLIUM OXIDE-BASED SEMICONDUCTOR SUBSTRATE AND SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Katsuhiro Kutsuki, Nagakute (JP); Keita Kataoka, Nagakute (JP); Daigo Kikuta, Nagakute (JP); Hiroki Miyake, Nisshin (JP); Shuhei Ichikawa, Nisshin (JP); Yoshitaka Nagasato, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 408 days.

(21) Appl. No.: 17/890,795

(22) Filed: Aug. 18, 2022

(65) Prior Publication Data
US 2023/0081110 A1    Mar. 16, 2023

(30) Foreign Application Priority Data
Sep. 13, 2021    (JP) .................... 2021-148753

(51) Int. Cl.
H10D 62/80    (2025.01)
H01L 21/465    (2006.01)
H10D 8/60    (2025.01)

(52) U.S. Cl.
CPC ............. *H10D 8/60* (2025.01); *H01L 21/465* (2013.01); *H10D 62/80* (2025.01)

(58) Field of Classification Search
CPC ..... H01L 21/465; H01L 29/24; H01L 29/872; H10D 8/60; H10D 62/80
(Continued)

(56) References Cited

U.S. PATENT DOCUMENTS

| 10,580,648 B2 * | 3/2020 | Jinno ................ H01L 29/66969 |
| 2015/0179445 A1 * | 6/2015 | Sasaki ............... H01L 21/02565 257/43 |
| 2019/0363197 A1 | 11/2019 | Sasaki et al. |

FOREIGN PATENT DOCUMENTS

JP    2008-303119 A    12/2008

OTHER PUBLICATIONS

S.J. Pearton et al., "A Review of Ga2O3 Materials, Processing, and Devices," Applied Physics Reviews 5, 011301 (2018), pp. 1-57, https://doi.org/10.1063/1.5006941.

(Continued)

*Primary Examiner* — Monica D Harrison
(74) *Attorney, Agent, or Firm* — Posz Law Group, PLC

(57) ABSTRACT

In a surface treatment method for a gallium oxide-based semiconductor substrate, a surface of the gallium oxide-based semiconductor substrate is flattened by dry etching with a self-bias of 150 V or more. After the surface of the gallium oxide-based semiconductor substrate is flattened, the surface of the gallium oxide-based semiconductor substrate is washed with a chemical solution containing $H_2SO_4$ to expose a step terrace structure on the surface of the gallium oxide-based semiconductor substrate.

5 Claims, 8 Drawing Sheets

(58) Field of Classification Search
USPC .......................................................... 257/43
See application file for complete search history.

(56) References Cited

OTHER PUBLICATIONS

W. Li et al., "2.44 kV Ga2O3 vertical trench Schottky barrier diodes with very low reverse leakage current", IEEE International Electron Devices Meeting Tech. Dig., 2018, pp. 193-196.
Hogan, J.E. et al., Chlorine-based dry etching of β-Ga2O3, Semiconductor Science and Technology, Apr. 14, 2016, vol. 31, 065006.

* cited by examiner

SURFACE TREATMENT METHOD FOR GALLIUM OXIDE-BASED SEMICONDUCTOR SUBSTRATE AND SEMICONDUCTOR DEVICE

CROSS REFERENCE TO RELATED APPLICATION

The present application claims the benefit of priority from Japanese Patent Application No. 2021-148753 filed on Sep. 13, 2021. The entire disclosure of the above application is incorporated herein by reference.

TECHNICAL FIELD

The present disclosure relates to a surface treatment method for a gallium oxide-based semiconductor substrate and a semiconductor device using a gallium oxide-based semiconductor substrate.

BACKGROUND

There has been known a device structure of a Schottky barrier diode manufactured by using a gallium oxide substrate.

SUMMARY

The present disclosure provides a surface treatment method for a gallium oxide-based semiconductor substrate including flattening a surface of the gallium oxide-based semiconductor substrate by a dry etching with a self-bias of 150 V or more, and exposing a step terrace structure on the surface of the gallium oxide-based semiconductor substrate by washing the surface of the gallium oxide-based semiconductor substrate with a chemical solution containing $H_2SO_4$ after the surface of the gallium oxide-based semiconductor substrate is flattened. The present disclosure also provides a semiconductor device in which a step terrace structure is exposed on a surface of a gallium oxide-based semiconductor substrate.

BRIEF DESCRIPTION OF DRAWINGS

Objects, features and advantages of the present disclosure will become apparent from the following detailed description made with reference to the accompanying drawings. In the drawings.

DETAILED DESCRIPTION

It has been required to improve device characteristics by suppressing an interface state of a surface of a gallium oxide-based semiconductor substrate. For example, in a case of forming a Schottky junction, when an interface state density becomes high, a Schottky barrier height ΦB becomes low, so that a leakage current increases.

A surface treatment method for a gallium oxide-based semiconductor substrate according to a first aspect of the present disclosure includes flattening a surface of the gallium oxide-based semiconductor substrate by dry etching with a self-bias of 150 V or more, and exposing a step terrace structure on the surface of the gallium oxide-based semiconductor substrate by washing the surface of the gallium oxide-based semiconductor substrate with a chemical solution containing $H_2SO_4$ after the surface of the gallium oxide-based semiconductor substrate is flattened.

A thin film of an altered layer may be formed on the surface of the gallium oxide-based semiconductor substrate. If there is a region where the altered layer cannot be removed during dry etching, the altered layer acts as a mask and the etching does not proceed, resulting in a large surface roughness. The present inventors have found that the altered layer can be appropriately removed by setting the self-bias of dry etching to 150 V or more. Accordingly, the flatness after etching can be improved. The present inventors have further found that a step terrace structure can be exposed on a surface by washing the surface after dry etching with the chemical solution containing H2SO4. As a result, it is possible to realize an ideal surface state in which the flatness is high and an interface layer does not exist, so that the generation of the interface state can be suppressed. Thus, it is possible to improve the device characteristics.

A semiconductor device according to a second aspect of the present disclosure includes a gallium oxide-based semiconductor substrate, and a metal layer disposed on a surface of the gallium oxide-based semiconductor substrate. At an interface between the gallium oxide-based semiconductor substrate and the metal layer, a step terrace structure is exposed on the surface of the gallium oxide-based semiconductor substrate.

A semiconductor device according to a third aspect of the present disclosure includes a gallium oxide-based semiconductor substrate, an insulating film disposed on a surface of the gallium oxide-based semiconductor substrate, and an electrode disposed on a surface of the insulating film. At an interface between the gallium oxide-based semiconductor substrate and the insulating film, a step terrace structure is exposed on the surface of the gallium oxide-based semiconductor substrate.

Figure 1:
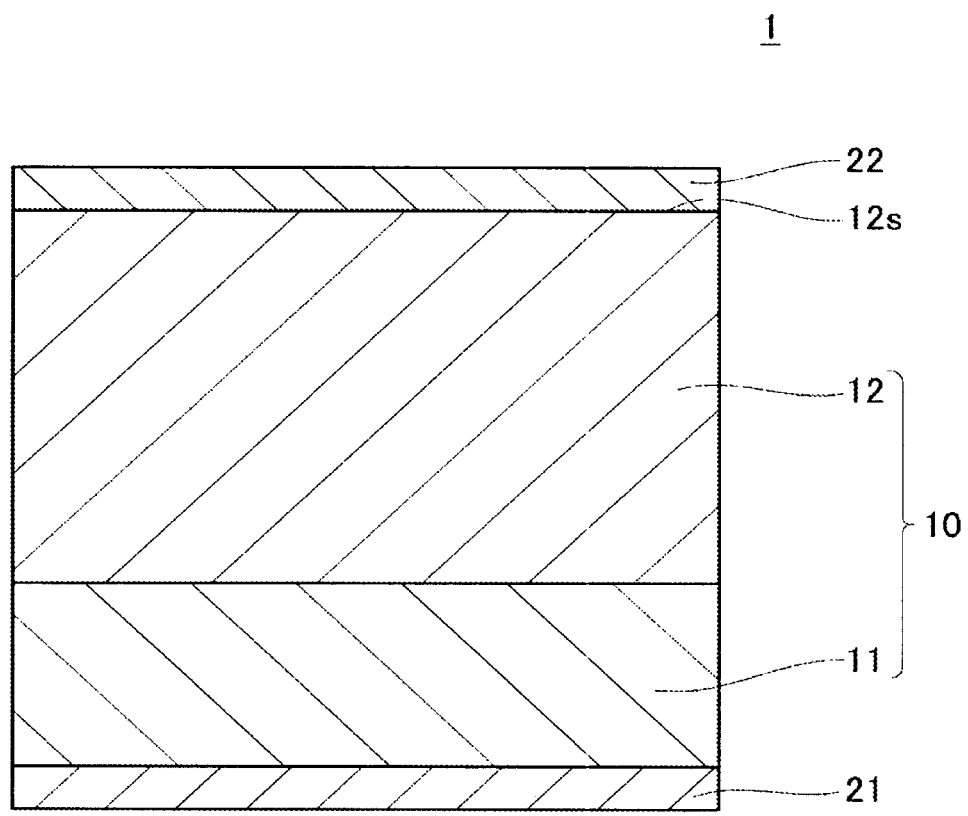
FIG. 1 is a schematic cross-sectional view of a semiconductor device according to an embodiment.

FIG. 1 shows a schematic cross-sectional view of a semiconductor device 1 according to an embodiment. The semiconductor device 1 is a Schottky barrier diode. The semiconductor device 1 includes a semiconductor substrate 10. The semiconductor substrate 10 has a structure in which a gallium oxide layer 12 having n-type conductivity is laminated on a gallium oxide substrate 11 having n-type conductivity. The semiconductor substrate 10 is an example of a gallium oxide-based semiconductor substrate. The gallium oxide layer 12 is a layer epitaxially grown by a hydride vapor phase epitaxy (HVPE) method. Front surfaces of the gallium oxide substrate 11 and the gallium oxide layer 12 are (001) planes. A cathode electrode 21 is disposed on a rear surface of the semiconductor substrate 10. The cathode electrode 21 has a structure in which titanium (Ti) and gold (Au) are laminated. An anode electrode 22 is disposed on a front surface 12s of the semiconductor substrate 10. The anode electrode 22 is made of nickel (Ni).

Figure 2:
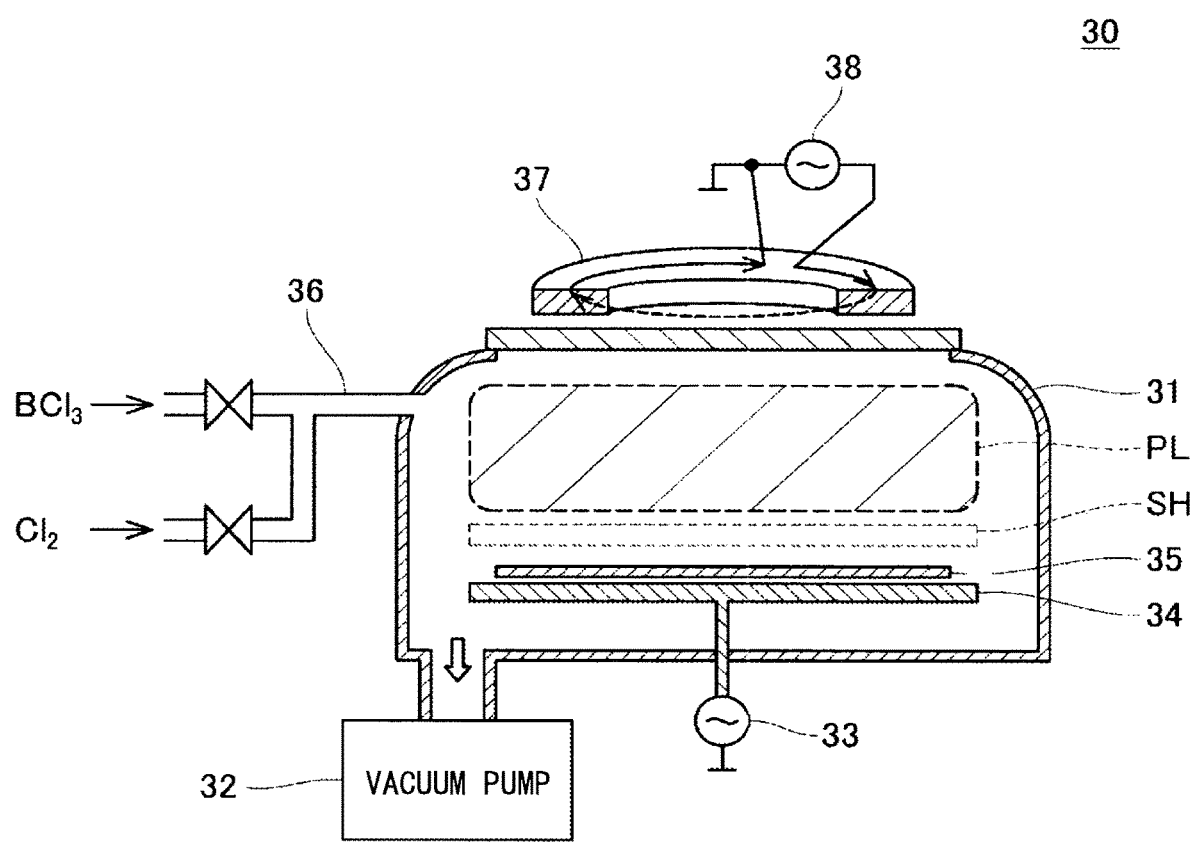
FIG. 2 is a schematic view of a dry etching apparatus.

FIG. 2 shows a schematic view of a dry etching apparatus 30 used in the present embodiment. The dry etching apparatus 30 is an inductively coupled plasma (ICP) etching apparatus. The inside of a chamber 31 is depressurized by a vacuum pump 32. In the chamber 31, a bias electrode 34 and a wafer 35 are housed. The bias electrode 34 is connected to a bias radio frequency (RF) power supply 33. In an upper part of the chamber 31, an induction coil 37 is disposed. The induction coil 37 is connected to an antenna RF power supply 38. Into the chamber 31, etching gas is supplied via a gas supply pipe 36. In the present embodiment, $BCl_3$ and $Cl_2$ are supplied in a switchable manner.

When antenna power is applied to the induction coil 37, plasma PL is generated directly under the induction coil 37. When bias power is applied to the bias electrode 34, self-bias Vds, which is a negative direct current (DC) voltage, can be generated. Between the plasma PL and the wafer 35, a sheath SH is generated. The strong electric field generated in the sheath SH can accelerate ions toward the wafer 35.

The self-bias is the voltage of the sheath SH. In other words, the self-bias is the potential difference between the plasma PL and the wafer 35. The self-bias is a voltage determined by various parameters such as the power of the bias RF power supply 33 and the antenna RF power supply 38, and the etching gas type. The self-bias can be measured in any dry etching apparatus. The self-bias can also be monitored during etching. Therefore, the self-bias is a general and versatile index for defining etching conditions.

Figure 3:
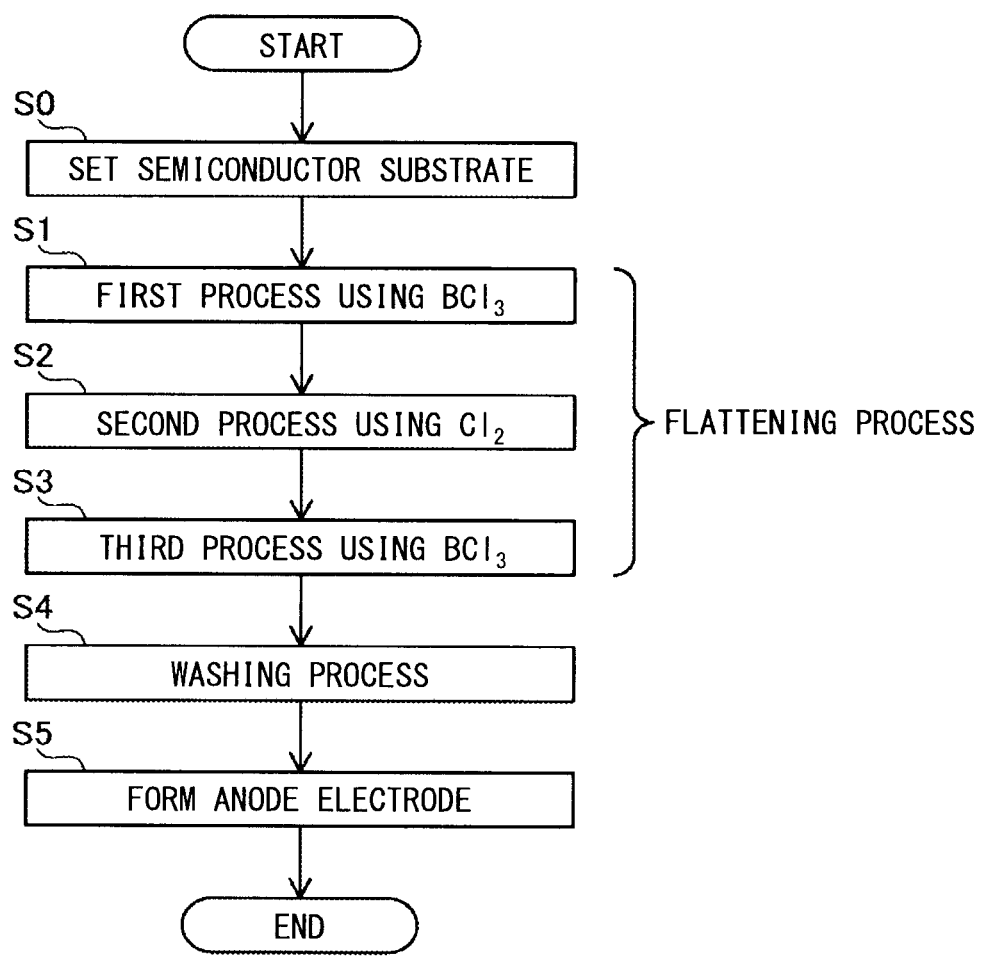
FIG. 3 is a flowchart illustrating a manufacturing method of the semiconductor device.

Next, a surface treatment method for the semiconductor substrate 10 in the semiconductor device 1 will be described with reference to the flowchart of FIG. 3. In S0, the semiconductor substrate 10 is set in the chamber 31 of the dry etching apparatus 30.

In S1 to S3, a flattening process of flattening the front surface 12s of the semiconductor substrate 10 is performed. The flattening process includes first to third processes. In the flattening process, dry etching is performed with a self-bias of 150 V or more. Accordingly, it is possible to form a flat surface without unevenness while maintaining an etching rate. The dry etching is performed using a gas containing chlorine. In the present embodiment, the power of the antenna RF power supply 38 is 800 W, the pressure in the chamber 31 is 1 Pa, the total flow rate is 30 sccm, and the etching time is 10 minutes. Each of the first to third processes will be described below.

In S1, the first process of performing dry etching with a self-bias of 150 V or more is performed using $BCl_3$. A thin film of an altered layer may be formed on the front surface 12s of the semiconductor substrate 10. In the first process, the altered layer can be effectively removed by bonding boron atoms with oxygen atoms of gallium oxide.

In S2, the second process of performing dry etching with a self-bias of 150 V or more is performed using $Cl_2$ gas. Since the etching gas does not contain boron, bonding between boron atoms and oxygen atoms does not occur. Therefore, although the etching rate is lowered, the processing flatness can be improved.

In S3, the third process of performing dry etching with a self-bias of 150 V or more is performed using $BCl_3$. A small amount of silicon atoms are present in the chamber 31 and in the atmosphere. When the silicon atoms are adsorbed on adsorption sites of the oxygen atoms of gallium oxide, the resistance of gallium oxide increases. Therefore, by finishing with the etching gas containing boron, the oxygen adsorption sites can be terminated with boron atoms. It is possible to suppress the adsorption of silicon atoms on the adsorption sites of the oxygen atoms.

Note that S1 to S3 can be continuously executed by switching the etching gas.

In S4, the semiconductor substrate 10 to which the flattening process has been performed is taken out from the chamber 31. Then, the front surface 12s of the semiconductor substrate 10 is washed with a chemical solution containing sulfuric acid ($H_2SO_4$). Accordingly, a step terrace structure (that is, a flat surface at the atomic level) can be exposed on the front surface 12s of the semiconductor substrate 10. In the present embodiment, a sulfuric acid hydrogen peroxide mixture (SPM) treatment in which sulfuric acid and hydrogen peroxide solution are mixed is performed.

If chlorine is present on the front surface 12s of the semiconductor substrate 10, a surface state is formed. In such a case, the Schottky barrier height $\Phi B$ is lowered, which causes a reverse leakage. In the present embodiment, chlorine remaining on the front surface 12s of the semiconductor substrate 10 is removed by the washing process in S4. Therefore, it is possible to suppress the formation of a surface state.

In S5, a metal layer (anode electrode 22) is formed on the front surface 12s. In the present embodiment, a nickel layer is formed. As a result, the semiconductor device 1 shown in FIG. 1 is completed.

Figure 4:
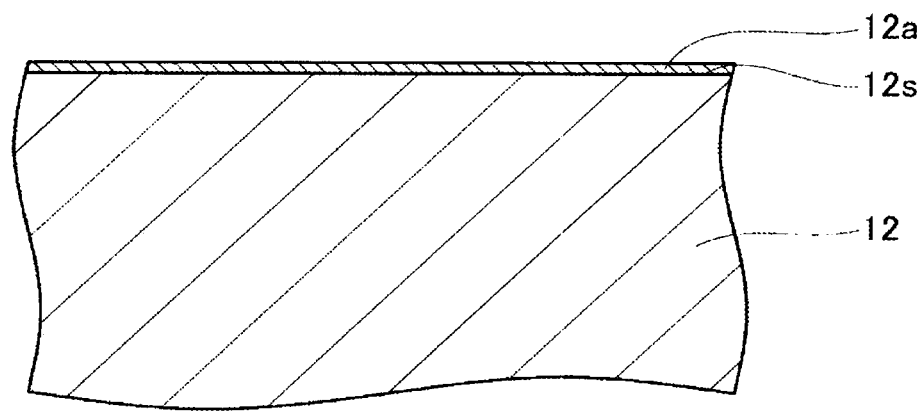
FIG. 4 is a cross-sectional view of the vicinity of a front surface of a gallium oxide layer before a flattening process is performed.
Figure 5:
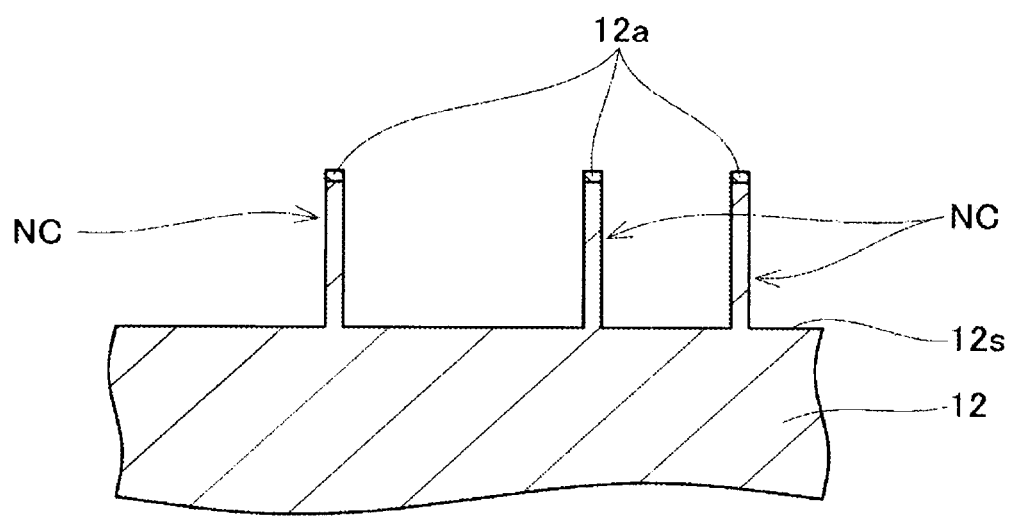
FIG. 5 is a cross-sectional view of the vicinity of the front surface of the gallium oxide layer after the flattening process is performed.

The reason why a self-bias of 150 V or more is required will be explained. FIG. 4 shows a cross-sectional view of the vicinity of the front surface 12s of the gallium oxide layer 12 before the flattening process (S1 to S3) is performed. A thin film of an altered layer 12a may be formed on the front surface 12s. The altered layer 12a is a layer that has been altered from gallium oxide due to adsorption of various elements and damage during processing. If there is a region where the altered layer 12a cannot be removed during dry etching of S1 to S3, the remaining altered layer 12a becomes a mask and stops etching. As a result, as shown in FIG. 5, nanocolumns NC (columnar foreign matter) are formed at portions of the remaining altered layer 12a.

Figure 6:
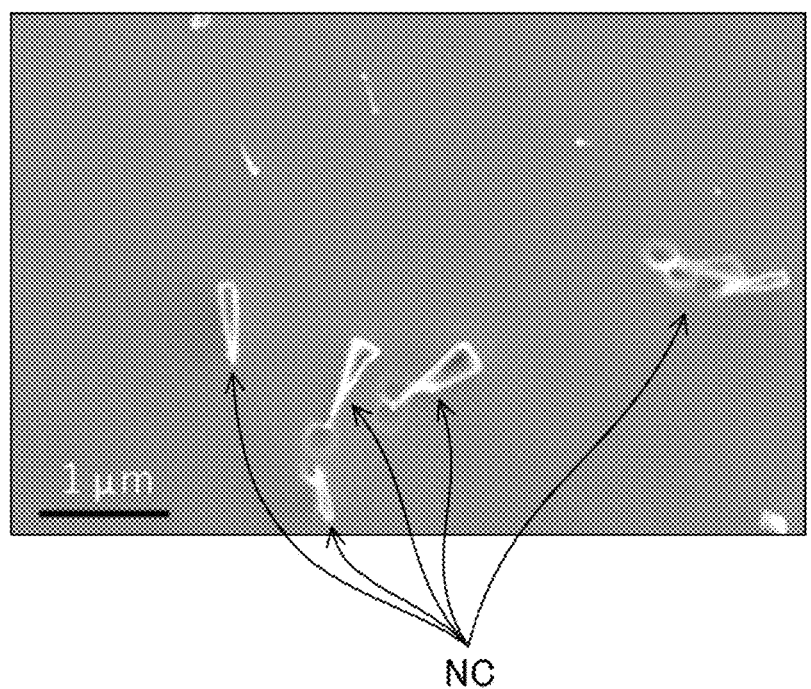
FIG. 6 is a scanning electron microscope (SEM) observation image of nanocolumns.

FIG. 6 shows a SEM observation image of the nanocolumns NC. When the nanocolumns NC are formed, the flatness of the front surface 12s is extremely deteriorated.

Figure 7:
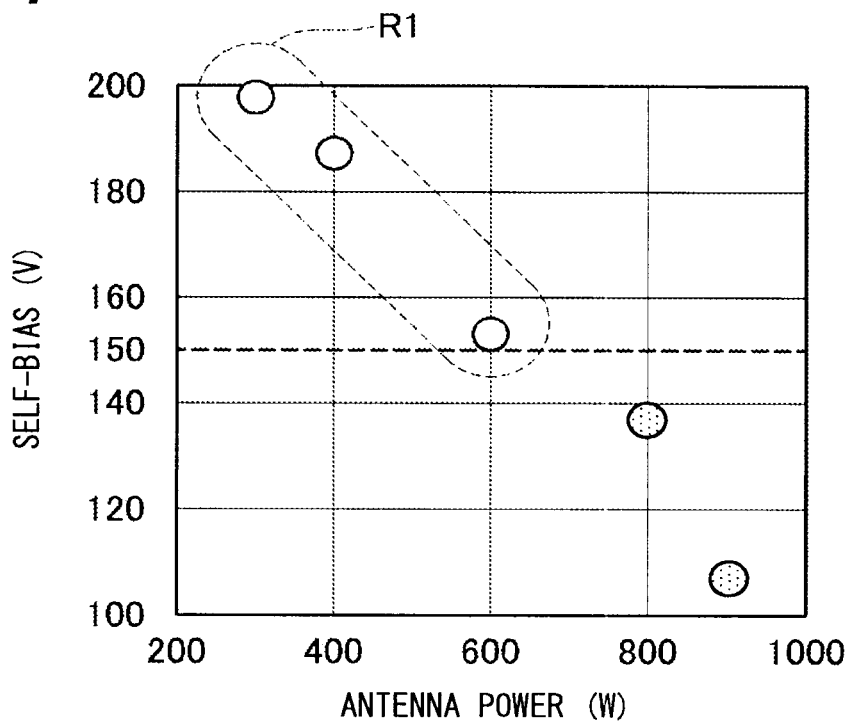
FIG. 7 is a correlation graph of antenna power and self-bias.
Figure 8:
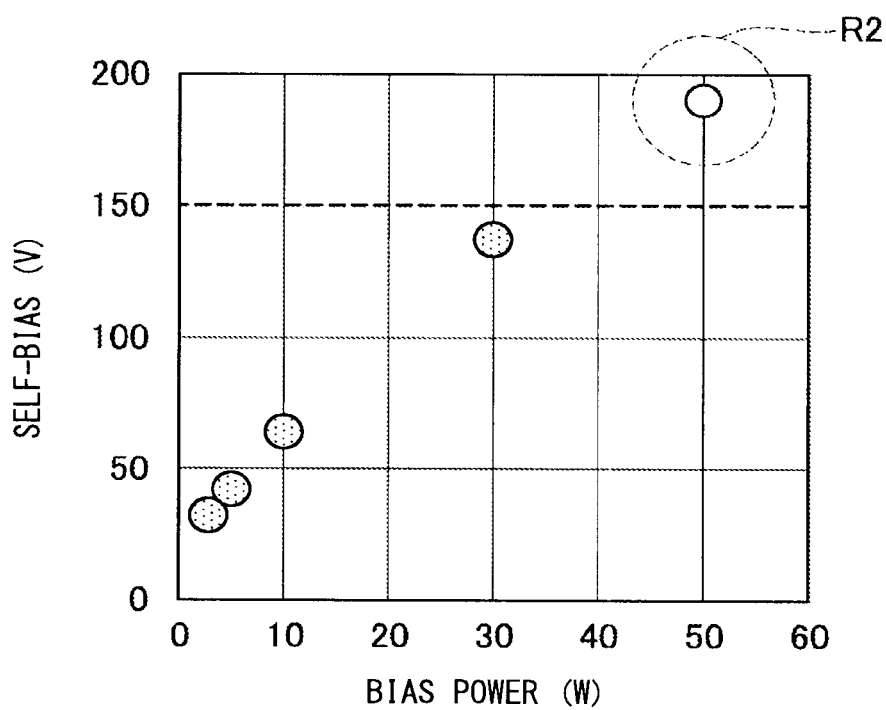
FIG. 8 is a correlation graph of bias power and self-bias.

Therefore, the present inventors have experimentally determined the range of self-bias in which nanocolumn NC is not formed. FIG. 7 and FIG. 8 show experimental results. The horizontal axis of FIG. 7 is the antenna power of the antenna RF power supply 38, and the vertical axis is the self-bias. In the experiment of FIG. 7, the bias power of the bias RF power supply 33 was fixed at 30 W. The horizontal axis of FIG. 8 is the bias power, and the vertical axis is the self-bias. In the experiment of FIG. 8, the antenna power was fixed at 800 W. In the experiments of FIG. 7 and FIG. 8, $BCl_3$ was used as the etching gas and the total pressure was set to 1 Pa.

The flattening process (S1 to S3) was performed under conditions shown in plots of FIG. 7 and FIG. 8. Then, it was confirmed whether or not nanocolumns NC were generated. The white circles in FIG. 7 and FIG. 8 indicate the conditions under which nanocolumns NC were not formed, and the dotted circles indicate the conditions under which nanocolumns NC were formed.

As shown in FIG. 7, it can be seen that the self-bias increases with decrease in the antenna power, and the nanocolumns NC were not formed in a region where the self-bias is 150 V or more (see region R1). Further, as shown in FIG. 8, it can be seen that the self-bias increases with increase in the bias power, and nanocolumns NC were not formed in a region where the self-bias is 150 V or more (see region R2).

From the above, the present inventors have found that the altered layer 12a (see FIGS. 4 and 5) can be appropriately removed by setting the self-bias of dry etching to 150 V or more. As a result, the formation of nanocolumn NC can be prevented, so that the flatness after etching can be improved. Since the flatness of the junction interface between the front surface 12s of the gallium oxide layer 12 and the anode electrode 22 can be increased, the electric field can be suppressed. Thus, it is possible to suppress the leakage current.

Figure 9:
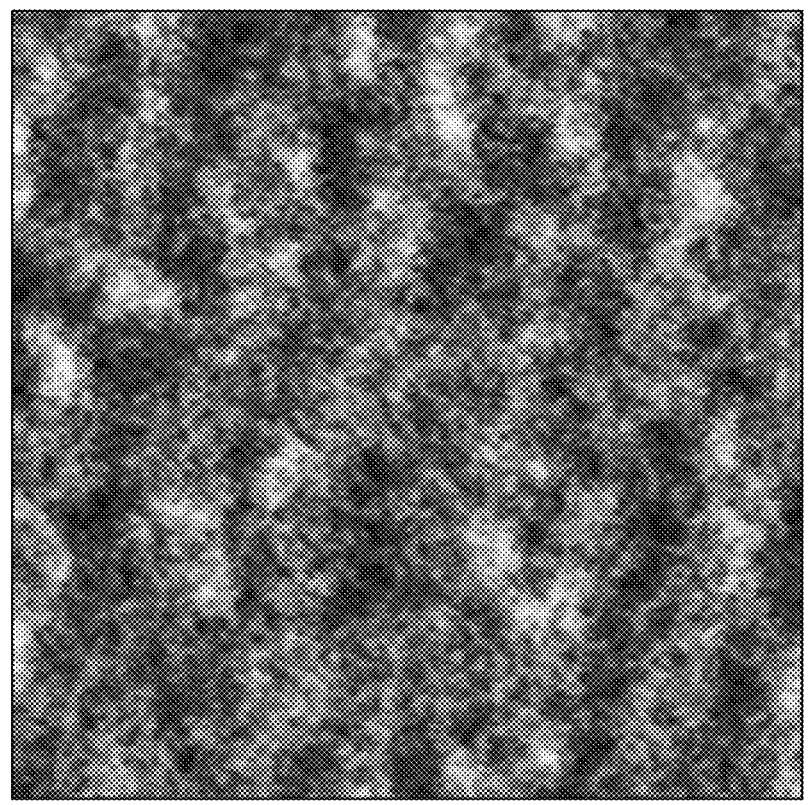
FIG. 9 is an atomic force microscope (AFM) observation image of the front surface of the gallium oxide layer after dry etching.
Figure 10:
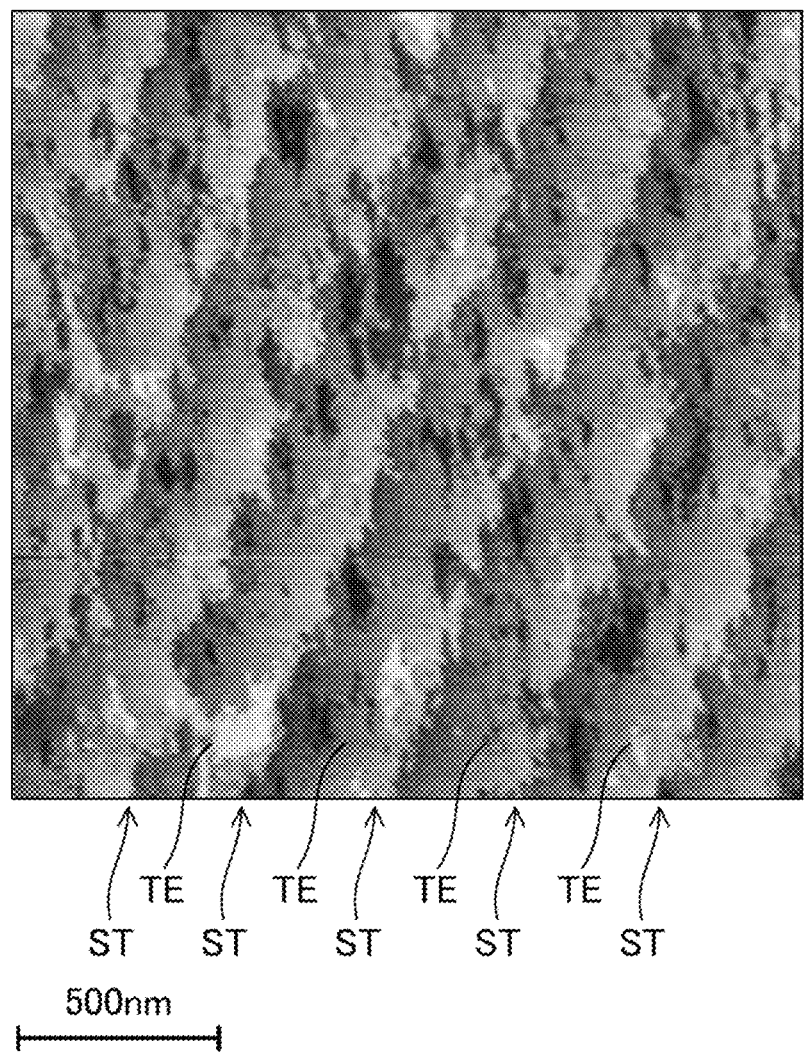
FIG. 10 is an AFM observation image of the front surface of the gallium oxide layer after washing.

FIG. 9 and FIG. 10 show AFM observation images of the front surface 12s of the gallium oxide layer 12. The plane orientation is the (001) plane. FIG. 9 is an image after dry etching in S3. FIG. 10 is an image after washing in S4. FIG. 9 and FIG. 10 have the same magnification.

The arithmetic mean roughness Ra of the surface after dry etching in FIG. 9 was 0.30 nm. On the other hand, the arithmetic mean roughness Ra of the surface after washing in FIG. 10 was 0.17 nm. From this results, it can be seen that the surface roughness can be reduced by the washing process.

In FIG. 9, no regularity is observed on the surface. On the other hand, in FIG. 10, the step terrace structure is observed. The step terrace structure is a structure in which ST, which is a stepped portion of one or more atoms, and terrace TE, which is flat at the atomic level, are repeated.

Based on the above, the present inventors have found that the step terrace structure can be exposed on the front surface 12s by washing the front surface 12s of the gallium oxide layer 12 after dry etching with a chemical solution containing $H_2SO_4$. The surface on which the step terrace structure is exposed is in an ideal surface state with extremely high flatness and no interface layer. As a result, the generation of the interface state can be suppressed, so that the decrease in the Schottky barrier height ΦB can be suppressed (after dry etching: 1.09 eV, after washing: 1.15 eV). Thus, it is possible to suppress the leakage current.

Although specific examples of the present disclosure have been described in detail above, these are merely examples and do not limit the scope of claims. The techniques described in the present description include various modifications and modifications of the specific examples illustrated above. In addition, the technical elements described in the present description or the drawings exhibit technical usefulness alone or in various combinations, and are not limited to the combinations described in the present description at the time of filing. In addition, the techniques illustrated in the present specification or drawings can achieve multiple purposes at the same time, and achieving one of the purposes itself has technical usefulness.

Modifications

The techniques disclosed in the present specification can be applied to various device structures not limited to the Schottky barrier diode. For example, the techniques may be applied to a field-effect transistor (FET) structure using an insulating film. In this case, electrodes are disposed above the front surface 12c of the gallium oxide layer 12 via an insulating film. At an interface between the gallium oxide layer 12 and the insulating film, a structure in which a step terrace structure is exposed on the front surface 12c of the gallium oxide layer 12 can be realized. As a result, the generation of an interface state can be suppressed, so that a leakage current can be suppressed and an on-resistance can be suppressed. Therefore, device characteristics can be improved.

The etching gas used in S1 and S3 is not limited to $BCl_3$. Any gas may be used as long as it contains boron and chlorine. The etching gas used in S2 is not limited to $Cl_2$. Any gas type may be used as long as it is a gas containing chlorine and not containing boron.

The step terrace structure of the gallium oxide layer 12 may vary. The techniques of the present specification can be applied to any of α-type and β-type.

The gallium oxide layer 12 may be a mixed-crystal gallium oxide containing at least one of indium, aluminum, and zinc. In other words, the gallium oxide layer 12 may be a mixed-crystal gallium oxide containing at least indium, a mixed-crystal gallium oxide containing at least aluminum, or a mixed-crystal gallium oxide containing at least zinc. Examples of mixed-crystal gallium oxide include $(InAlGa)_2O_3$, $(AlGa)_2O_3$, $InGaO_3(ZnO)$, and the like.

What is claimed is:

1. A surface treatment method for a gallium oxide-based semiconductor substrate, comprising:
   flattening a surface of the gallium oxide-based semiconductor substrate by a dry etching with a self-bias of 150 V or more; and
   exposing a step terrace structure on the surface of the gallium oxide-based semiconductor substrate by washing the surface of the gallium oxide-based semiconductor substrate with a chemical solution containing $H_2SO_4$ after the surface of the gallium oxide-based semiconductor substrate is flattened.

2. The surface treatment method according to claim 1, wherein
   the flattening includes performing the dry etching using a gas containing chlorine.

3. The surface treatment method according to claim 2, wherein
   the flattening includes:
   a first process of performing the dry etching using a gas containing boron and chlorine;
   a second process of performing the dry etching using a gas containing chlorine and not containing boron after the first process; and
   a third process of performing the dry etching using a gas containing boron and chlorine after the second process.

4. The surface treatment method according to claim 3, wherein
   the first process uses the gas containing $BCl_3$,
   the second process uses the gas containing $Cl_2$, and
   the third process uses the gas containing $BCl_3$.

5. The surface treatment method according to claim 1, wherein
   the gallium oxide-based semiconductor substrate is a mixed-crystal gallium oxide substrate containing at least one of indium, aluminum, and zinc.

* * * * *